United States Patent [19]

Dathe et al.

[11] 3,791,884

[45] Feb. 12, 1974

[54] METHOD OF PRODUCING A PNP SILICON TRANSISTOR

[75] Inventors: Joachim Dathe, Leo Grasser, both of Munich; Wolfgang Muller, Vaterstetten, all of Germany

[73] Assignee: Siemens Aktiengesellschaft, Berlin, Munich, Germany

[22] Filed: Feb. 19, 1971

[21] Appl. No.: 116,943

[30] Foreign Application Priority Data

Feb. 23, 1970 Germany .......... 2008319

[52] U.S. Cl. .......... 148/187, 148/1.5, 148/189

[51] Int. Cl. .......... H01l 7/44

[58] Field of Search .......... 148/187.15

[56] References Cited

UNITED STATES PATENTS 3,669,768 6/1972 Beadle et al. .......... 148/187

3,529,347 9/1970 Ingless et al. .......... 29/571

3,418,181 12/1968 Robinson .......... 148/187

*Primary Examiner*—L. Dewayne Rutledge

*Assistant Examiner*—J. M. Davis

*Attorney, Agent, or Firm*—Curt M. Avery; Arthur E. Wilfond; Herbert L. Lerner

[57] ABSTRACT

During the production of a pnp silicon transistor, one side of a p-conducting silicon wafer is provided with a base zone through masked diffusion of phosphorus atoms. A subsequent diffusion process increases the phosphorus concentration at the surface of the base zone to $10^{20}$ to $10^{21}$ phosphorous atoms/cm$^3$. The same phosphorus concentration is produced at the opposite side of the silicon wafer. The emitter is produced in the region of the base zone through a masked diffusion of acceptor atoms. Finally, the phosphorus-doped layer is removed from the reverse or back side of the semiconductor wafer.

5 Claims, 3 Drawing Figures

METHOD OF PRODUCING A PNP SILICON TRANSISTOR

Figure 1:
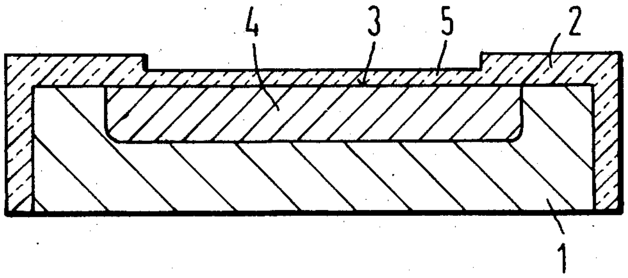

Our invention relates to a method for producing a pnp silicon transistor wherein a component region at the surface of the base zone produced in a wafer-shaped monocrystal of p-conducting silicon, the donor concentration is so increased through diffusion of donors in a subsequent diffusion process, that an aluminum electrode alloyed into this region forms a barrier-free contact.

The production details of silicon planar transistors or mesa transistors and other silicon diffusion transistors, as well as the technique of their production may be assumed to be known. Details pertaining to the production of planar transistors are found, for example, in the literature "Post office electric. Engin." 56 (January 1964), No. 4, pages 239 to 243. The planar method as well as the mesa technique, are usually utilized for the production of transistors of npn type, while the method is rarely used for the production of transistors of pnp type. The reason for this is primarily in the fact that such transistors are considerably more complicated in their production, than the npn types. It is an object of our invention to produce pnp devices.

Prior to producing the emitter zone, phosphorus is diffused into the reverse side of the wafer shaped original crystal which forms the collector of the transistor. The phosphorus should be indiffused at higher concentrations in order to develop a thin, phosphorus doped surface zone. The surface concentration in this phosphorus doped zone amounts to about $10^{20}$ to $10^{21}$ phosphorus atoms/cm$^3$. This indiffused phosphorus getters all types of heavy metals, dissolved in the semiconductor, thus making them harmless. It is recommended to adjust the thickness of the semiconductor wafer in the customary manner, e.g. to a value of 50 $\mu$m to 1 mm.

Consequently, the production of a pnp transistor of planar type proceeds in the following manner, for example: starting with an n-conducting wafer-shaped silicon monocrystal having a donor concentration of about $10^{14}$ to $10^{16}$ donor atoms/cm$^3$, a diffusion mask for producing the base zone is produced at the surface of this crystal. To this end, a masking layer, particularly of $SiO_2$ or silicon nitride or a combination of both, is applied. This layer is removed at the locality at which the base zone is to be produced, by a photo resist etching technique and the diffusion for producing a p-conducting base zone is effected by heating this arrangement in the presence of $B_2O_3$ vapor and at a temperature, for example, of 900° to 1000°C. During this application step, a thin diffusion zone develops which is highly doped with boron. The thus indiffused amount of boron is distributed through an after-diffusion process, for example at 1200°C and in an oxidizing atmosphere into a greater silicon volume which establishes the desired depth of penetration and surface concentration. During an after-diffusion lasting 60 minutes, the base zone penetrates into the semiconductor crystal, up to a depth of approximately 3$\mu$m, which is one of the usually employed depths of penetration for the base-collector p-n junction.

Following the production of the base zone, the $SiO_2$ is removed from the reverse side of the semiconductor wafer, whereby the front side is masked with photo resist, wax and the like. This front side is now heated in a phosphorus containing atmosphere, preferably in the presence of $P_2O_5$ to about 1050°C for a period of 30 minutes. As a result, the heavy metals which happen to be present in the silicon and which are often disturbing, are made harmless. The next step is the production of the emitter zone which is effected by indiffusing phosphorus by using a new mask which corresponds to the size of the emitter to be produced. Finally, with the aid of the photo resist technique, the semiconductor surface is again exposed within the emitter and the base zone and contacting with aluminum is carried out, for example, in the manner known from the above-mentioned "Post office electr. Engin." article.

The production of the pnp type is considerably more complicated by comparison, since the doping conditions in the base region are essentially different than those of the emitter in the npn type. Namely, since following the emitter diffusion, the aforementioned reasons necessitate the production of a new masking layer, through precipitation of silicon dioxide out of a reaction gas, e.g. methyl siloxane because the thin oxide layer which stems from the emitter diffusion could not protect the emitter sufficiently against the subsequent donor diffusion and a thermal after-oxidation although feasible, is not expedient due to the boron depletion. The contact locations of the base zone may then be exposed with the aid of a photo resist technique. At this locality, the donor concentration of the base zone is then so increased through indiffusion of donors, that the subsequently alloyed-in aluminum contact could no longer result in a p-n junction. Since here, too, the dopant is obtained from the gaseous phase in form of its oxide, for technological reasons, a new oxide layer occurs at the contact place which must then be exposed again. Here, too, a photo resist etching technique is utilized, since photo resist is suitable as an etching mask when hydrofluoric acid is used as an etching agent for exposing the base zone. The Al contacting is carried out in the known manner.

The use of aluminum as a contact metal for the base, as well as for the emitter, has a number of essential technical advantages (G. L. Schnable Proc. IEEE Vol. 57, No. 9, Sept. 69, p 1570) so that the contact diffusion process, which is necessary for the barrier-free contacting of the n-conducting base, is easily accepted.

As had been recognized by the invention, a considerable work saving is obtained according to the invention, whereby phosphorus atoms are diffused into the region of the base zone, which should be lightly doped, as well as into the surface of the silicon wafer, which lies opposite the base zone, at a surface concentration of about $10^{20}$ to $10^{21}$ phosphorus atoms/cm$^3$. Also, after the production of the emitter zone which is adjusted to a surface concentration of about $10^{20}$ to $10^{21}$ acceptor atoms/cm$^3$, the phosphorus doped region at the back side of the silicon wafer is again removed.

Thus, according to the invention, the contact diffusion which serves for contacting the base zone with an aluminum electrode, is carried out together with the gettering of the semiconductor body, prior to emitter diffusion. This is easily possible when one adheres to the surface concentration required by the invention, since the higher donor concentration produced through contact diffusion is not that strongly affected in one part of the base zone by the ensuing emitter diffusion, that no barrier-free contact could any longer occur in this region of the base zone.

The method of the invention offers several considerable advantages.

1. elimination of a thermal or pyrolytic oxidation following the emitter diffusion, since after the emitter diffusion has been completed, no additional diffusion processes are necessary,
2. the contact diffusion and the gettering are combined into one process,
3. elimination of the phosphorus glass etching, according to contact diffusion,
4. elimination of a coating and etching process, prior to the gettering process, for exposing the wafer's back side. Instead, a photo resist process is carried out which is otherwise required for opening the base contact windows and the reverse side of the wafer,
5. the emitter diffusion profile and the base thickness are not influenced by the contact diffusion,
6. the elimination of several chemical and physical work processes, compared to the previous production of the pnp types, affords an increase in the yield and the quality.

Figure 2:
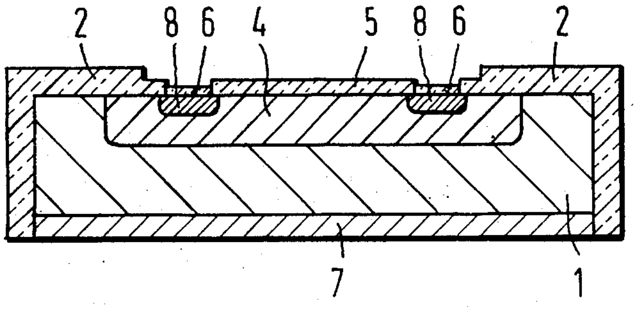
Figure 3:
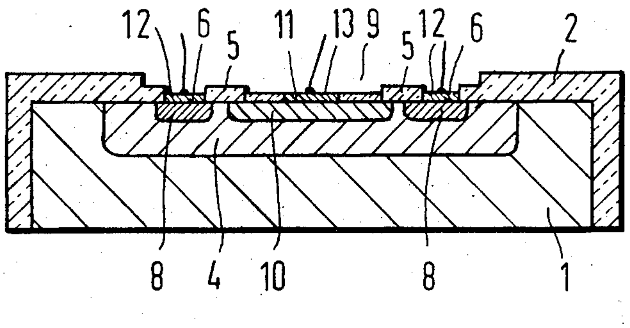

The drawing shows in FIGS. 1 to 3 sequential steps for carrying out the process of the invention. The invention is not to be limited to these steps but rather to the claims.

The surface of a wafer-shaped p-conducting silicon monocrystal 1 is provided with a masking layer 2, particularly of $SiO_2$, having an acceptor (particularly boron) concentration of about $10^{15}$ to $10^{16}$ atoms/cm$^3$. This layer is coated with photo resist. The photo resist layer is exposed locally so that it is removed from the lower-lying $SiO_2$ film at the location at which the base zone is being produced. However, the remaining parts of this film, remain. By using diluted hydrofluoric acid, the $SiO_2$ is etched off at the location not covered by the photo resist, so that a diffusion window 3 occurs for the production of the base. After the photo resist layer is removed, the device is placed into a diffusion furnace. This furnace consists, for example, of a horizontally positioned quartz tube which is traversed by an inert carrier gas and is enclosed by a tubular furnace. Into this quartz tube, the sourse which delivers $P_2O_5$ vapor as well as the silicon monocrystal, provided with the masking 2 are placed and heated. The carrier gas is charged with the $P_2O_5$ and arrives thereupon at the heated silicon wafer. While a phosphorus glass layer results at location 3 of the silicon surface, which is not coated by the masking layer 2, phosphorus atoms diffuse into the silicon surface accompanied by the production of a thin, highly doped diffusion zone. Arsenic or antimony may be indiffused in lieu of phosphorus. The thus indiffused phosphorus, arsenic or antimony, is distributed by an afterdiffusion process, for example at 1200°C, in an oxidizing atmosphere into a larger silicon volume thus providing the adjustment of the desired depth of penetration and surface concentration and a sufficiently thick $SiO_2$ layer 5 upon base window 3. At a surface concentration of $10^{18}$ to $10^{19}$ donor atoms/cm$^3$ and a total depth of penetration of about 3$\mu$m, one obtains an optimum base zone 4, for high frequency. The condition of the device which prevails immediately following indiffusion of the base zone, is illustrated in cross-section in FIG. 1. This FIG. also shows the oxide layer 5 which results at the silicon surface in window 3.

The following step consists in using a photo resist etching technique for exposing the contact areas 6 at the base region and for exposing the reverse or back side of the semiconductor wafer 1. However, the masking layer 2 or 5 is kept intact at the remaining locations of the silicon surface. According to the method of the invention, phosphorus is then diffused into the silicon on the back side of the wafer as well as at the for example, ring-shaped contact area 6 for the base at a high surface concentration, i.e. amounting to about $10^{20}$ to $10^{21}$ phosphorus atoms/cm$^3$. The tempering that is necessary to this end, is preferably effected at 1050°C and for a period of about 30 minutes. Then, an n-conducting region is formed at the back side of the wafer 1 as well as at contact areas 6, which is considerably more n-conductive than the base zone 4. The highly-doped n-conducting region which occurs at the back side of the silicon wafer is denoted as 7, while the highly-doped n-conducting region is denoted 8. In addition, a masking layer of $SiO_2$ with a strong phosphorus content, forms at the diffusion points and may be further strengthened through an after-oxidation process, (30 min., 1050°C, moist $O_2$) so that it may be masked, during indiffusion.

It should be noted that a thick masking layer 5 is present during all these steps, at the locality of the emitter still to be produced, so that the region in the base to be occupied by the emitter, is in no way adversely affected by the high concentration of the contact diffusion (FIG. 2).

The masking layer which covers the region of the future emitter is now removed at this point and the diffusion window 9 required for the production of the emitter, is produced. The steps which now follow are illustrated with reference to FIG. 3:

In this condition, the arrangement is again placed into a diffusion furnace and heated therein, together with a source for $B_2O_3$ vapor. At the same time, a $SiO_2$ layer with a strong boron content forms at the surface of the silicon which is exposed in diffusion window 9. Boron diffuses from this $SiO_2$ layer into the beneath-lying silicon, accompanied by the formation of an emitter zone. The emitter window 9 is arranged so far from the contact point of the base zone 6, that the developing emitter zone 10 does not approach the region 8 of the base zone.

The diffusion process which serves for the production of the emitter 10 is again effected in a diffusion furnace. Gaseous doping substance is delivered to the silicon wafer, heated to 1050°C, with the assistance of an inert carrier gas. The production of the emitter is the last process to be carried out at high temperatures, so that in this state, all p-n and other junctions, have attained their final position.

The following steps serve for contacting the emitter and base zone, by using aluminum as contacting material. To this end, again with the aid of a photo resist etching technique, the contact areas 6 and 11 of the base zone 4 and of emitter zone 10, are exposed. At the same time, the dopant containing $SiO_2$ present at the back side of the silicon wafer, is etched away. Thereupon, an aluminum film 12 or 13 is vapor-deposited at the exposed base. The emitter contact points 6 and 11 of the device are deposited and sintered-in in a subsequent tempering process or alloyed-in. Finally, the phosphorus doped zone 7 which is still present on the back side of the silicon wafer, following the gettering process, is etched away. To this end, the front side of the silicon wafer is covered with photo resist or wax, etc.

The manufacture of the contacting of the base zone and of the emitter zone can occur under total area vaporization, whereupon the excess parts of the aluminum layer are etched away by employing the photo resist etching method. Another embodiment is localized vaporization by an appropriate vaporizing mask.

This device is also alloyed on a base, serving as a collector electrode, with its back side. The base may be of bold-plated Vacon, for example, and mounted in the customary manner to a closed housing.

We claim:

1. A method of producing a pnp silicon planar transistor which comprises producing an n-conducting base zone in a p-conducting silicon wafer having an adjusted thickness not greater than 1 mm, then forming a p-conducting emitter zone through indiffusion of appropriate dopants, through a diffusion mask forming a layer of insulating material, provided with appropriate diffusion windows, including the steps of: removing the insulating layer forming the diffusion mask to thereby expose the base zone surfaces provided for contacting the base zone and the back side of the silicon crystal lying opposite the base zone; subjecting the exposed surfaces to a second diffusion process using phosphorus as the activator to simultaneously produce highly doped n-conducting zones in the base zone affected by said phosphorus diffusion, and in a surface zone on the back side of the silicon wafer; separating the highly doped n-zone on the back side of the semiconductor body from the base zone by a zone of the p-conducting original material forming the collector zone of the transistor; forming an emitter zone in the base zone by separating said base zone from the highly doped n-conducting zones of the base zone which were produced during said phosphorus diffusion; removing the highly doped, n-conducting zone from the back side of the silicon wafer; and providing the zones of the transistor with appropriate contact electrodes by applying an aluminum electrode at least at a contact point provided for in the base and emitter zones.

2. The method of claim 1 wherein the indiffusion of the phosphorus is effected at a temperature of about 1050°C.

3. The method of claim 1, wherein following the last diffusion process, contact points are exposed at the base and the emitter zone and are contacted by a vapor deposited aluminum layer.

4. The method of claim 3, wherein the aluminum layer is locally vapor-deposited upon the contact points of the base and of the emitter zone.

5. The method of claim 3, wherein the semiconductor surface provided with the exposed contact points of the base and of the emitter zone, is covered by a total area aluminum metallization by vapor deposition, said metallization is then removed locally by the photo resist etching method.

* * * * *